(12) United States Patent
Chen et al.

(10) Patent No.: US 12,008,831 B2
(45) Date of Patent: Jun. 11, 2024

(54) SENSING DEVICE SUBSTRATE AND DISPLAY APPARATUS HAVING THE SAME

(71) Applicant: Au Optronics Corporation, Hsinchu (TW)

(72) Inventors: Ming-Yao Chen, Hsinchu (TW); Jui-Chi Lo, Hsinchu (TW); Wei-Ming Huang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 399 days.

(21) Appl. No.: 17/355,179

(22) Filed: Jun. 23, 2021

(65) Prior Publication Data

US 2022/0067323 A1   Mar. 3, 2022

Related U.S. Application Data

(60) Provisional application No. 63/070,880, filed on Aug. 27, 2020.

(30) Foreign Application Priority Data

Jan. 5, 2021   (TW) .................................. 110100291

(51) Int. Cl.
*G06V 40/13* (2022.01)
*H01L 27/12* (2006.01)

(52) U.S. Cl.
CPC ...... *G06V 40/1306* (2022.01); *H01L 27/1255* (2013.01)

(58) Field of Classification Search
CPC .......... G06V 40/13–1394; G06V 40/12–1394; G06V 40/00–70; G06F 3/041–04897; G06F 3/04184; G06F 3/044–0448; G06F 3/042–0428; G06F 21/32; H01L 27/12–1296; H01L 27/14678;
(Continued)

(56) References Cited

U.S. PATENT DOCUMENTS 5,329,112 A * 7/1994 Mihara ............. H01L 27/14665
257/E27.141
10,438,044 B2   10/2019 Wu et al.
(Continued)

FOREIGN PATENT DOCUMENTS

| CN | 106156753 | 11/2016 |
| CN | 106022324 | 4/2019 |
| CN | 107425038 | 1/2020 |

*Primary Examiner* — Amr A Awad
*Assistant Examiner* — Aaron Midkiff
(74) *Attorney, Agent, or Firm* — JCIPRNET

(57) ABSTRACT

A sensing device substrate includes a substrate and a sensing device. The sensing device is disposed on the substrate and includes a first electrode, a second electrode, a sensing layer, a conductive layer, and a first insulating layer. The first electrode is located on the substrate. The second electrode is overlapped with the first electrode. The sensing layer is located between the second electrode and the first electrode. The conductive layer is overlapped with the second electrode and electrically connected to the first electrode. The conductive layer has a first opening, and the first opening is overlapped with the sensing layer. The first insulating layer is located between the conductive layer and the second electrode. A display apparatus including the sensing device substrate is also provided.

19 Claims, 11 Drawing Sheets

(58) Field of Classification Search
CPC ... H01L 27/1255; H01L 27/146–14698; H01L 23/5225; H01L 27/14612–14616; H01L 27/14623; H01L 27/1251–1259; A61B 5/1172
See application file for complete search history.

(56) References Cited

U.S. PATENT DOCUMENTS

| | | |
|---|---|---|
| 10,747,978 B2 | 8/2020 | Ding et al. |
| 2018/0053032 A1 | 2/2018 | Ding et al. |
| 2019/0026530 A1 | 1/2019 | Wu et al. |
| 2019/0280039 A1* | 9/2019 | Jia ..................... G02F 1/133512 |
| 2019/0377858 A1* | 12/2019 | He ....................... G06V 10/141 |
| 2020/0012837 A1* | 1/2020 | Lee ...................... H04N 23/743 |
| 2020/0134284 A1* | 4/2020 | Ling .................... H10K 59/126 |
| 2021/0366966 A1* | 11/2021 | Li ..................... H01L 27/14685 |

* cited by examiner

SENSING DEVICE SUBSTRATE AND DISPLAY APPARATUS HAVING THE SAME

CROSS-REFERENCE TO RELATED APPLICATION

This application claims the priority benefit of U.S. provisional application Ser. No. 63/070,880, filed on Aug. 27, 2020, and Taiwan application serial no. 110100291, filed on Jan. 5, 2021. The entirety of each of the above-mentioned patent applications is hereby incorporated by reference herein and made a part of this specification.

BACKGROUND OF THE INVENTION

Field of the Invention

The invention relates to a sensing device substrate, and more particularly to a display apparatus including the sensing device substrate.

Description of Related Art

The development of display apparatuses is changing with each passing day. In particular, the full-screen design has become the mainstream of small and medium-sized screen specifications. In order to achieve a full screen, in-cell fingerprint sensing (iFP) of the fingerprint sensing function integrated into the on-screen display is a key technique, wherein the full-screen non-fixed-point fingerprint sensing function is expected to support a variety of applications, enhance user experience, and increase the added value of the panel, which is currently a key development project.

In terms of practical application requirements, iFP needs to be equipped with a light collimation design to overcome the interference of reflected light from adjacent fingerprint ridges/valleys caused by the thickness of the cover glass. However, the light collimation design needs to limit the light-receiving area of the sensing device, resulting in a decrease in photocurrent (Iph), and in turn resulting in similar light/dark current values, i.e., insufficient light/dark current ratio, thus affecting the contrast quality of fingerprint images. If the non-illuminated area of the sensing device is reduced to reduce the dark current, the capacitance of the sensing device is decreased, leading to poor circuit coupling efficiency under the active photosensitive circuit. As a result, the fingerprint output voltage is low and the ridge/valley contrast of the fingerprint is compressed, thus also reducing the contrast quality of the fingerprint image.

SUMMARY OF THE INVENTION

The invention provides a sensing device substrate with good fingerprint image contrast quality.

The invention provides a display apparatus with good fingerprint sensing.

A sensing device substrate of the invention includes: a substrate; and a sensing device located on the substrate, wherein the sensing device includes: a first electrode located on the substrate; a second electrode overlapped with the first electrode; a sensing layer located between the second electrode and the first electrode; a conductive layer overlapped with the second electrode and electrically connected to the first electrode, wherein the conductive layer has a first opening, and the first opening is overlapped with the sensing layer; and a first insulating layer located between the conductive layer and the second electrode.

In an embodiment of the invention, the sensing device further includes a second insulating layer, and the second insulating layer is located between the second electrode and the first electrode and has a second opening, wherein the second opening is overlapped with the sensing layer.

In an embodiment of the invention, an area ratio of the first opening to the second opening is between 1/9 and 4/9.

In an embodiment of the invention, the sensing device includes a first capacitance and a second capacitance, the first capacitance includes the second electrode and the first electrode, and the second capacitance includes the conductive layer and the second electrode.

In an embodiment of the invention, the second electrode is a transparent electrode.

In an embodiment of the invention, the conductive layer is an opaque conductive layer.

In an embodiment of the invention, the second electrode is an opaque electrode and has a third opening, wherein the third opening is overlapped with the first opening.

In an embodiment of the invention, the third opening is smaller than the first opening.

In an embodiment of the invention, the sensing device substrate further includes a first signal line and a second signal line disposed on the substrate, wherein the first electrode is electrically connected to one of the first signal line and the second signal line, and the second electrode is electrically connected to the other of the first signal line and the second signal line.

A display apparatus of the invention includes: a pixel array substrate; and the above sensing device substrate, wherein the sensing device substrate is overlapped with the pixel array substrate.

In an embodiment of the invention, the pixel array substrate includes a pixel electrode and a common electrode, and the conductive layer is electrically connected to the first electrode via one of the pixel electrode and the common electrode.

In an embodiment of the invention, the conductive layer is the other of the pixel electrode and the common electrode.

In an embodiment of the invention, the display apparatus further includes a cover substrate, wherein the sensing device substrate is located between the pixel array substrate and the cover substrate.

In an embodiment of the invention, the cover substrate includes a light-shielding layer, the light-shielding layer has a fourth opening, and the fourth opening is overlapped with the first opening.

In an embodiment of the invention, the fourth opening is larger than the first opening.

In an embodiment of the invention, the sensing device further includes a second insulating layer, and the second insulating layer is located between the second electrode and the first electrode and has a second opening, wherein the second opening is overlapped with the sensing layer.

In an embodiment of the invention, the display apparatus further includes a cover substrate, wherein the pixel array substrate is located between the sensing device substrate and the cover substrate.

In an embodiment of the invention, the sensing device substrate further includes a dimming structure, the dimming structure is located between the sensing device and the pixel array substrate, and the dimming structure has a fifth opening, and the fifth opening is overlapped with the first opening.

In an embodiment of the invention, the fifth opening is larger than the first opening.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
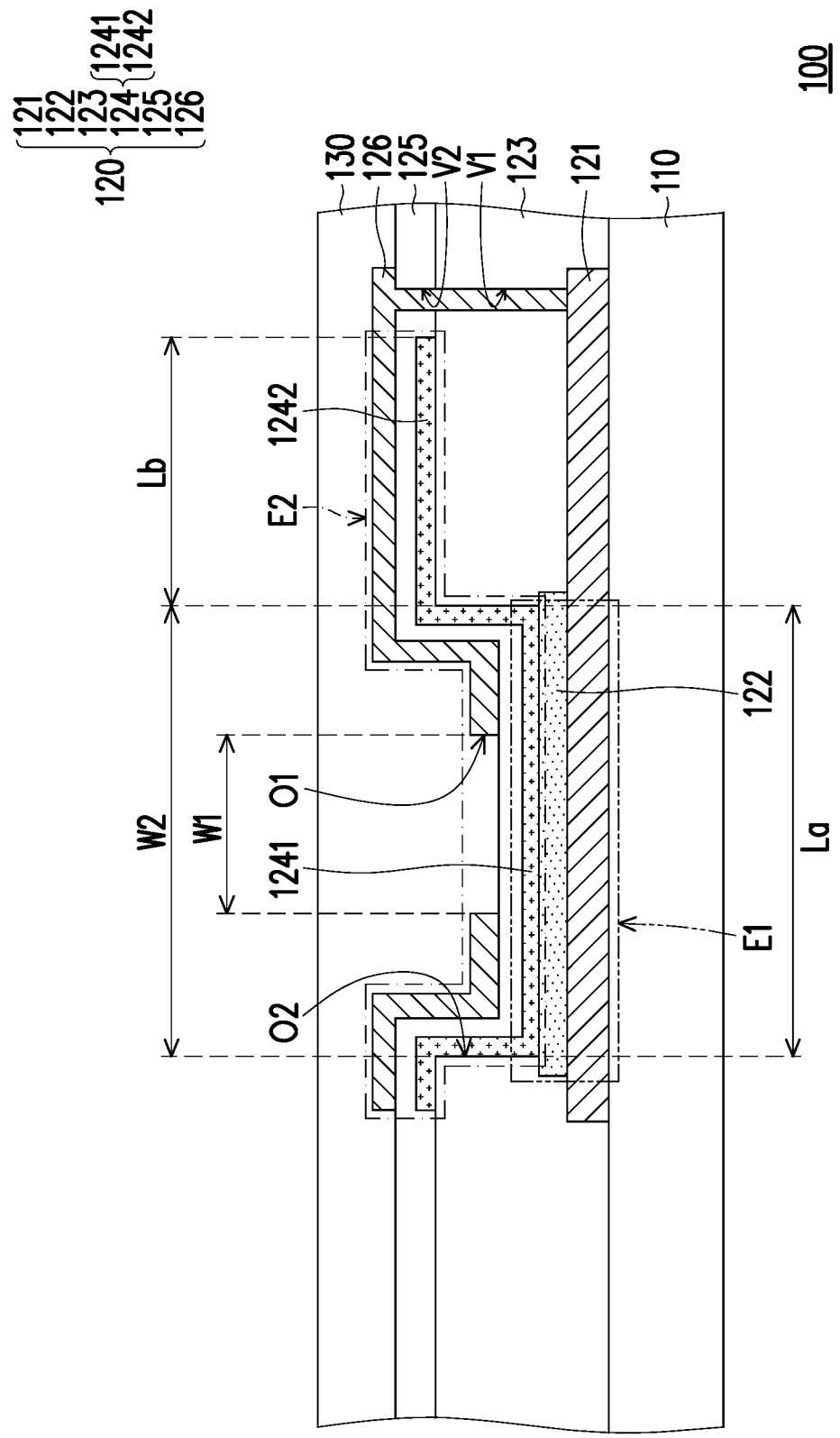
FIG. 1 is a schematic cross-sectional view of a sensing device substrate 100 according to an embodiment of the invention.

FIG. 1 is a schematic cross-sectional view of a sensing device substrate 100 according to an embodiment of the invention. Referring to FIG. 1, the sensing device substrate 100 includes a substrate 110 and a sensing device 120, and the sensing device 120 is located on the substrate 110. The sensing device 120 includes a first electrode 121, a sensing layer 122, a second electrode 124, a first insulating layer 125, and a conductive layer 126. The first electrode 121 is located on the substrate 110. The second electrode 124 is overlapped with the first electrode 121. The sensing layer 122 is located between the second electrode 124 and the first electrode 121. The conductive layer 126 is overlapped with the second electrode 124 and electrically connected to the first electrode 121, wherein the conductive layer 126 has a first opening O1, and the first opening O1 is overlapped with the sensing layer 122. The first insulating layer 125 is located between the conductive layer 126 and the second electrode 124.

In the sensing device substrate 100 of an embodiment of the invention, the capacitance formed by the overlapping of the conductive layer 126 and the second electrode 124 may reduce the area of the sensing layer 122 while maintaining the capacitance value of the sensing device 120. In this way, the dark current of the sensing device 120 is reduced, thereby increasing the light/dark current ratio of the sensing device 120, so that the sensing device 120 has a good fingerprint image contrast quality. Moreover, the first opening O1 of the conductive layer 126 may adjust the light-receiving angle together with the openings of other film layers, such as excluding light with a larger incident angle, so as to provide a light collimation effect.

Hereinafter, in conjunction with FIG. 1, the implementation of each device and film layer of the sensing device substrate 100 is described, but the invention is not limited thereto.

In the present embodiment, the substrate 110 is a transparent substrate, and the material thereof is, for example, a quartz substrate, a glass substrate, a polymer substrate, or other suitable materials, but the invention is not limited thereto. In addition to various film layers used to form the sensing device 120, signal lines and other various film layers used to form switching devices, for example, may be disposed on the substrate 110.

Based on the consideration of conductivity, the first electrode 121 of the sensing device 120 generally adopts a metal material, such as molybdenum, aluminum, titanium, copper, gold, silver, or other conductive materials, or a stack of any two or more of the above materials. However, the invention is not limited thereto.

In the present embodiment, the sensing device 120 further includes a second insulating layer 123. The second insulating layer 123 is located between the second electrode 124 and the first electrode 121 and has a second opening O2, wherein the second opening O2 is overlapped with the sensing layer 122. In some embodiments, the second insulating layer 123 is located on the substrate 110, the first electrode 121, and the sensing layer 122, and the second opening O2 of the second insulating layer 123 is completely overlapped with the sensing layer 122. In some embodiments, the area of the second opening O2 is similar to the area of the sensing layer 122. In the present embodiment, the material of the sensing layer 122 is, for example, silicon-rich oxide (SRO) or other suitable materials.

In the present embodiment, the second electrode 124 and the first electrode 121 form a first capacitance E1 of the sensing device 120. That is, the sensing device 120 includes the first capacitance E1, and the first capacitance E1 includes the second electrode 124 and the first electrode 121. Specifically, the portion of the second electrode 124 located in the second opening O2 may be defined as a sensing portion 1241, the portion of the second electrode 124 located on the second insulating layer 123 may be defined as an extending portion 1242, the sensing layer 122 is sandwiched between the sensing portion 1241 and the first electrode 121, and the second insulating layer 123 is sandwiched between the extending portion 1242 and the first electrode 121. When the thickness of the second insulating layer 123 is significantly greater than the thickness of the sensing layer 122, the first capacitance E1 is mainly formed by the sensing portion 1241 of the second electrode 124 and the first electrode 121.

The length ratio of the extending portion 1242 of the second electrode 124 to the sensing portion 1241 may be between 1/4 and 2. For example, in the present embodiment, the ratio of a length Lb of the extending portion 1242 to a length La of the sensing portion 1241 is 3/5, that is, Lb/La=3/5, but the invention is not limited thereto.

In the present embodiment, the second electrode 124 is a transparent electrode. In some embodiments, the second electrode 124 may adopt an alloy, a nitride of a metal material, an oxide of a metal material, an oxynitride of a metal material, or other suitable materials, or stacked layers of the above conductive materials, such as indium tin oxide, indium zinc oxide, aluminum tin oxide, aluminum zinc oxide, indium gallium zinc oxide, or other suitable oxides, or stacked layers of at least two of the above, but the invention is not limited thereto.

In the present embodiment, the conductive layer 126 is an opaque conductive layer. Therefore, the conductive layer 126 may provide a light-shielding function. At the same time, the first opening O1 may be used as a portion of a light collimation design and control the light-receiving angle of the sensing layer 122 together with the openings of other film layers. The material of the conductive layer 126 may be, for example, molybdenum, aluminum, titanium, copper, gold, silver, or other conductive materials, or a stack of any two or more of the above materials.

The first insulating layer 125 is sandwiched between the conductive layer 126 and the second electrode 124, and the conductive layer 126 and the second electrode 124 are overlapped to form a second capacitance E2 of the sensing device 120. That is, the sensing device 120 further includes the second capacitance E2, and the second capacitance E2 includes the conductive layer 126 and the second electrode 124. In addition, the conductive layer 126 is electrically connected to the first electrode 121. That is, the conductive layer 126 and the first electrode 121 have the same voltage level. Therefore, the sensing device 120 includes the first capacitance E1 and the second capacitance E2, and the first capacitance E1 and the second capacitance E2 are connected in parallel.

The aperture ratio of the first opening O1 of the conductive layer 126 to the second opening O2 of the second insulating layer 123 may be between 1/3 and 2/3. For example, in the present embodiment, the ratio of an aperture W1 of the first opening O1 to an aperture W2 of the second opening O2 is about 2/5, but the invention is not limited thereto.

In the present embodiment, without changing the aperture W1 of the first opening O1 that is a portion of the light collimation design, reducing the aperture W2 of the second opening O2 means that the area of the sensing layer 122 may be reduced at the same time, thereby reducing dark current. In this case, the aperture ratio W1/W2 of the first opening O1 and the second opening O2 may be increased to between 1/3 and 2/3. As the area of the sensing layer 122 is reduced, the overlapping area of the sensing portion 1241 and the first electrode 121 is reduced, and the first capacitance E1 is reduced. Therefore, the reduced capacitance value of the first capacitance E1 may be supplemented by the second capacitance E2 formed by the conductive layer 126 and the second electrode 124.

In some embodiments, the second insulating layer 123 may also have a via V1, the first insulating layer 125 may also have a via V2, the via V2 is overlapped with the via V1, and the conductive layer 126 may be connected to the first electrode 121 via the via V2 of the first insulating layer 125 and the via V1 of the second insulating layer 123, but the invention is not limited thereto.

In some embodiments, the sensing device substrate 100 may further include a planarization layer 130, and the planarization layer 130 planarizes the upper surface of the sensing device substrate 100 to facilitate assembly or storage. The material of the second insulating layer 123, the first insulating layer 125, and the planarization layer 130 may include a transparent insulating material, such as silicon oxide, silicon nitride, silicon oxynitride, an organic material, an acrylic material, a siloxane material, a polyimide material, an epoxy material, etc., but the invention is not limited thereto. The second insulating layer 123, the first insulating layer 125, and the planarization layer 130 may also have a single-layer structure or a multi-layer structure, respectively. The multi-layer structure is, for example, a stack of any two or more layers of the above insulating materials and may be combined and changed as needed.

Figure 2A:
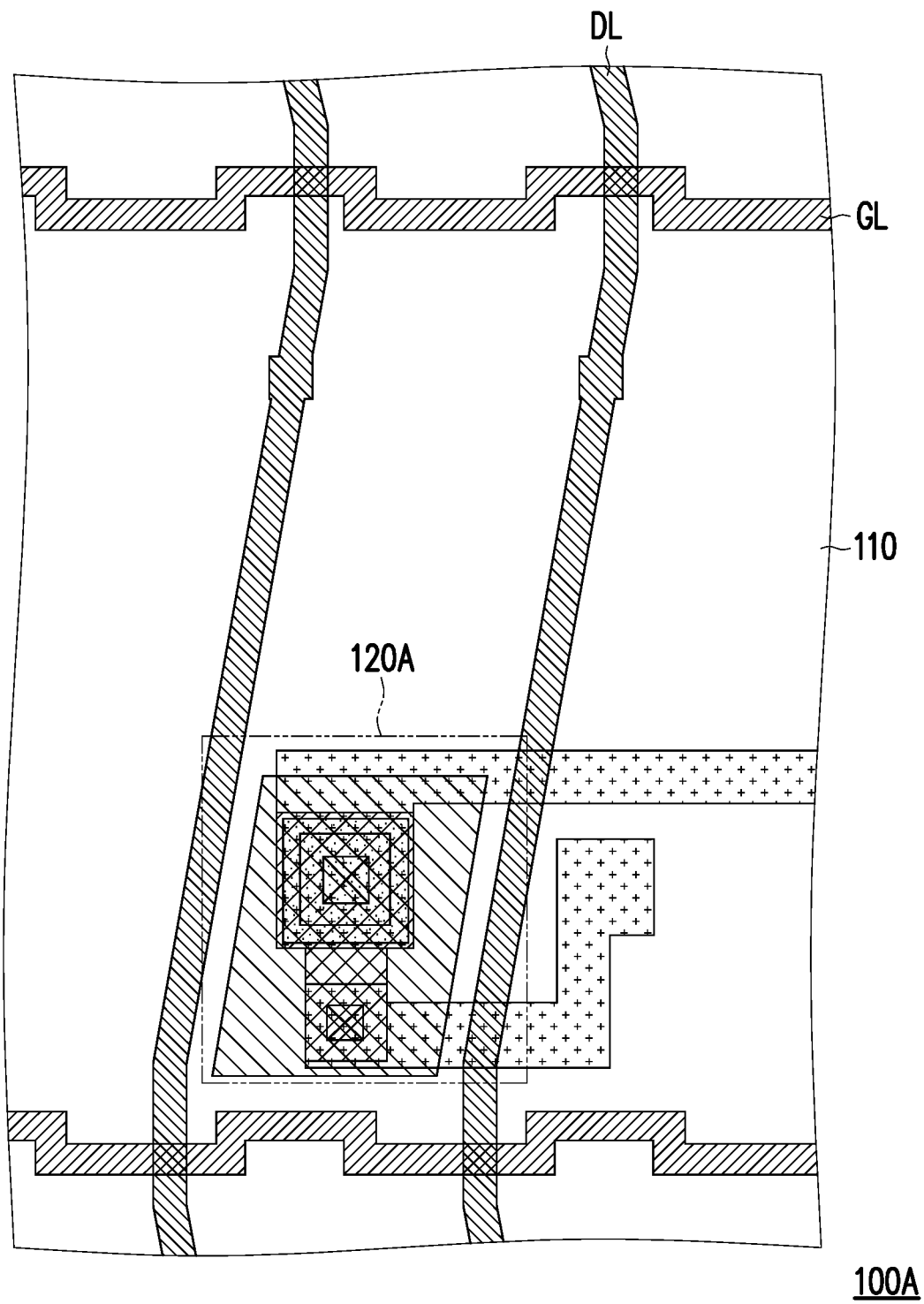
FIG. 2A is a schematic top view of a sensing device substrate 100A according to an embodiment of the invention.
Figure 2B:
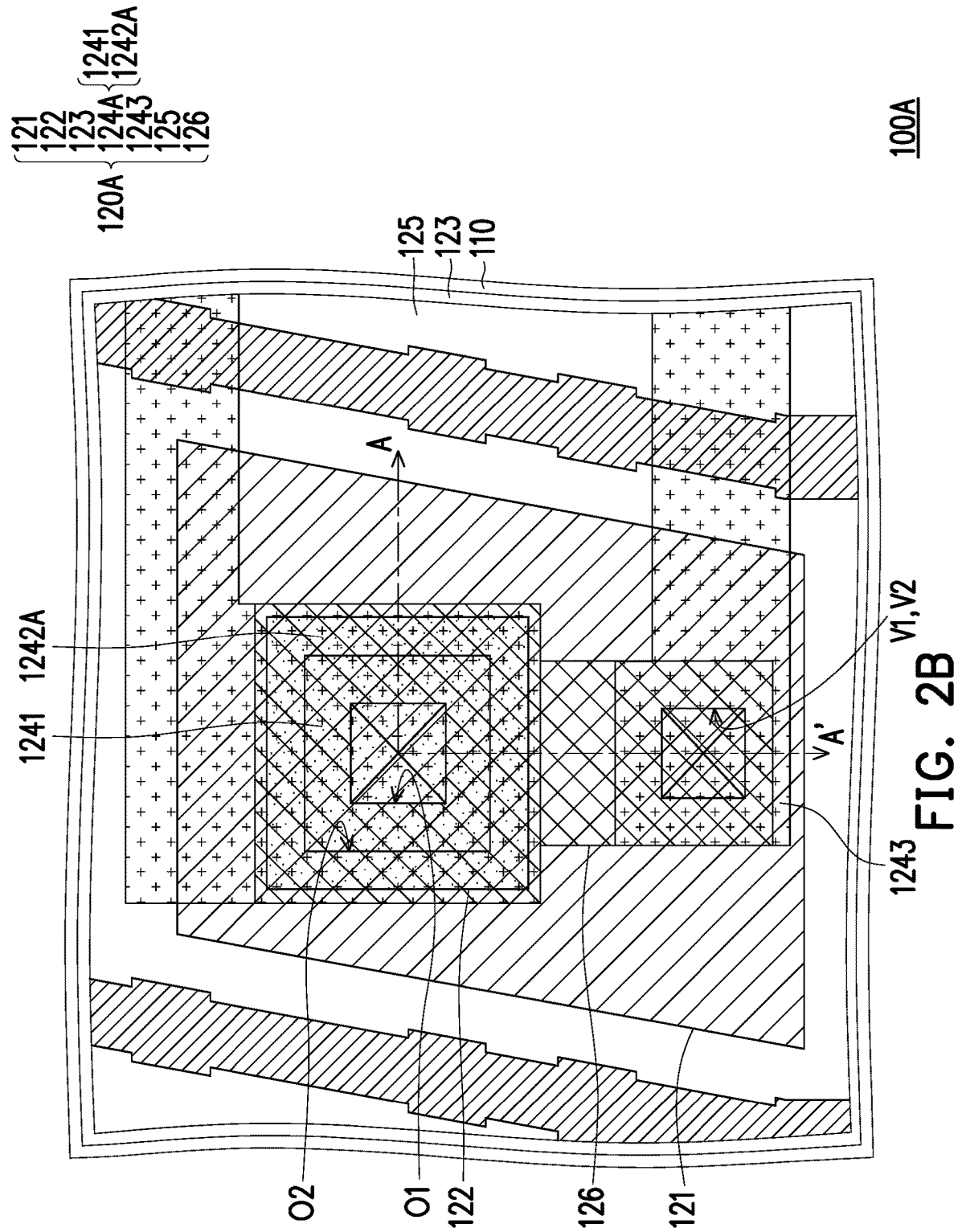
FIG. 2B is an enlarged schematic diagram of a sensing device 120A of the sensing device substrate 100A of FIG. 2A.
Figure 2C:
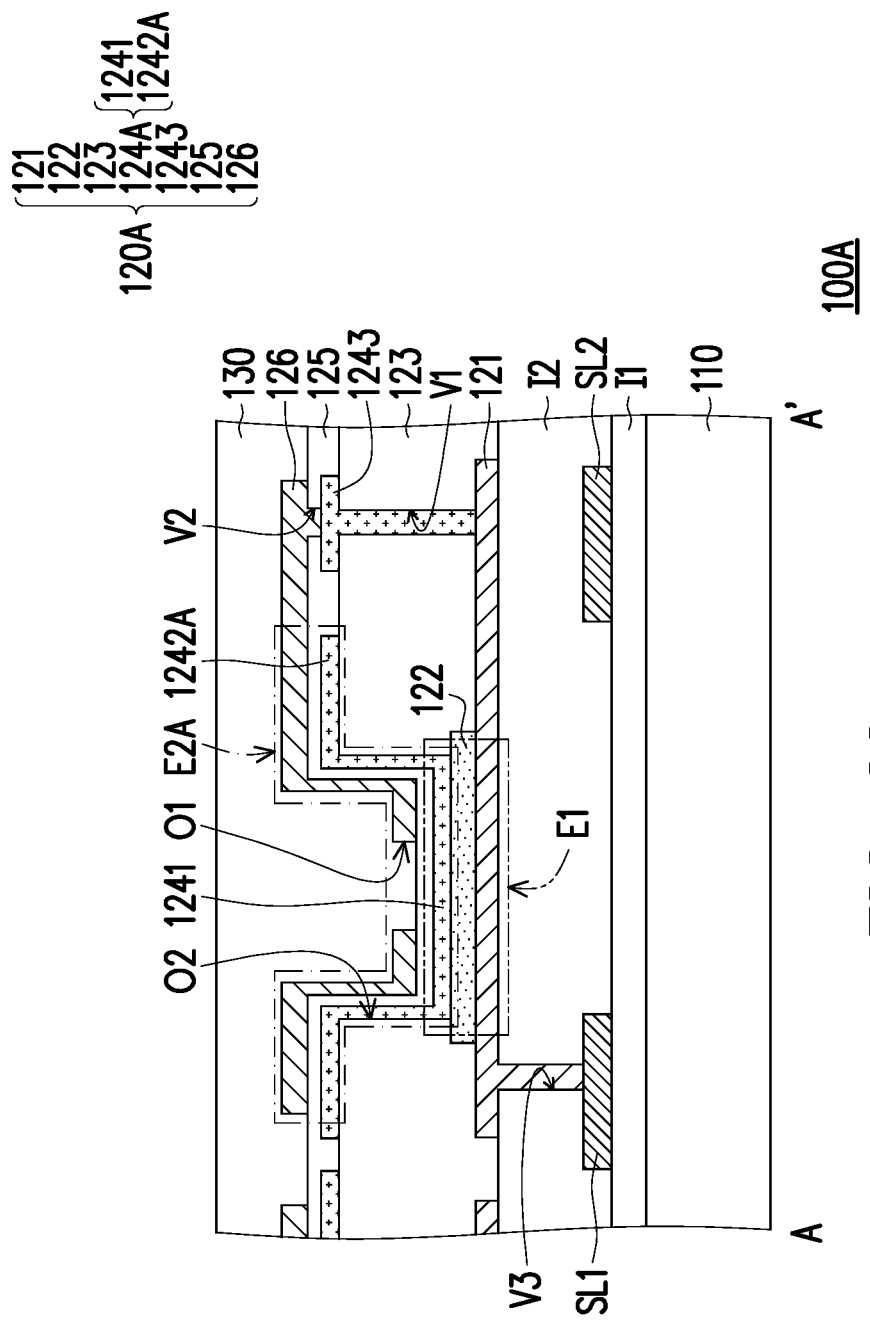
FIG. 2C is a schematic cross-sectional view along section line A-A' of FIG. 2B.
Figure 2D:
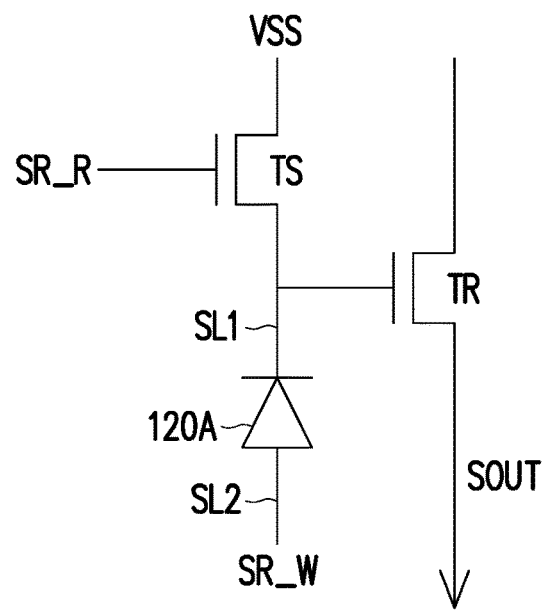
FIG. 2D is a schematic circuit diagram of the sensing device substrate 100A of FIG. 2A.

Hereinafter, the description of another embodiment of the invention is provided. FIG. 2A is a schematic top view of a sensing device substrate 100A according to an embodiment of the invention. FIG. 2B is an enlarged schematic diagram of a sensing device 120A of the sensing device substrate 100A of FIG. 2A. FIG. 2C is a schematic cross-sectional view along section line A-A' of FIG. 2B. FIG. 2D is a schematic circuit diagram of the sensing device substrate 100A of FIG. 2A. Hereinafter, in conjunction with FIG. 2A to FIG. 2D, the description of the implementation of each device and film layer of the sensing device substrate 100A is provided, and the reference numerals and related content used in the embodiment of FIG. 1 are adopted, but the invention is not limited thereto.

Referring to FIG. 2A and FIG. 2C at the same time, the sensing device substrate 100A includes the substrate 110, the sensing device 120A, and the planarization layer 130, and the sensing device 120A is disposed between the substrate 110 and the planarization layer 130. The sensing device substrate 100A may further include scan lines GL and data lines DL. The scan lines GL and the data lines DL are disposed on the substrate 110 for transmitting scan signals and data signals.

Referring to FIG. 2B and FIG. 2C at the same time, compared with the sensing device 120 of the sensing device substrate 100 of FIG. 1, the difference in the structure in the sensing device 120A shown in FIG. 2B to FIG. 2C is: the sensing device 120A includes the first electrode 121, the sensing layer 122, the second insulating layer 123, a second electrode 124A, a connecting portion 1243, the first insulating layer 125, and the conductive layer 126, and the second electrode 124A includes the sensing portion 1241 and an extending portion 1242A.

In the present embodiment, the extending portion 1242A of the second electrode 124A is located on the second insulating layer 123, and the extending portion 1242A surrounds the sensing portion 1241. The connecting portion 1243 is separated from the extending portion 1242A and the sensing portion 1241. The second insulating layer 123 may have the via V1, and the connecting portion 1243 may be connected to the first electrode 121 via the via V1 of the second insulating layer 123.

In the present embodiment, the first insulating layer 125 may have the via V2, and the conductive layer 126 may be connected to the connecting portion 1243 via the via V2 of the first insulating layer 125, so that the conductive layer 126 may be electrically connected to the first electrode 121.

In the present embodiment, the conductive layer 126 is overlapped with the second electrode 124A, the first insulating layer 125 is sandwiched between the conductive layer 126 and the second electrode 124A, and the conductive layer 126 and the second electrode 124A may form a second capacitance E2A. In addition, the sensing portion 1241 of the second electrode 124A and the first electrode 121 may form the first capacitance E1. Therefore, in the present embodiment, the sensing device 120A may include the first capacitance E1 and the second capacitance E2A.

Referring to FIG. 2B, in some embodiments, the area ratio of the first opening O1 to the second opening O2 may be between 1/9 and 4/9. For example, in the present embodiment, the ratio of the area of the first opening O1 to the area of the second opening O2 is about 1/4, but the invention is not limited thereto.

Referring to FIG. 2C, in the present embodiment, the sensing device substrate 100A further includes an insulating layer I1, an insulating layer I2, a first signal line SL1, and a second signal line SL2. The insulating layer I1 is located on the substrate 110, the first signal line SL1 and the second signal line SL2 are disposed on the insulating layer I1, and the insulating layer I2 is located between the first signal line SL1 and the first electrode 121 and between the second signal line SL2 and the first electrode 121. The first electrode 121 is electrically connected to the first signal line SL1, and the second electrode 124A may be electrically connected to the second signal line SL2, but the invention is not limited thereto. For example, in the present embodiment, the insulating layer I2 may have a via V3, and the first electrode 121 may be connected to the first signal line SL1 via the via V3. In addition, the second electrode 124A may also be connected to the second signal line SL2 via the second insulating layer 123 and other vias in the insulating layer I2.

For example, referring to FIG. 2D, the first signal line SL1 is coupled between the sensing device 120A, a reset transistor TS, and a read transistor TR, and the second signal line SL2 may transmit a drive signal SR_W to the sensing device 120A. The reset transistor TS may receive a drive signal SR_R to return the first signal line SL1 to a voltage VSS level. When the sensing device 120A is performing sensing, the sensing device 120A starts to leak current, causing the voltage level on the first signal line SL1 to drop. At this time, the drive signal SR_W from the second signal line SL2 may raise the voltage level on the first signal line SL1 by the capacitance of the sensing device 120A, thereby turning on the read transistor TR, so that an output signal SOUT may be read.

Figure 3:
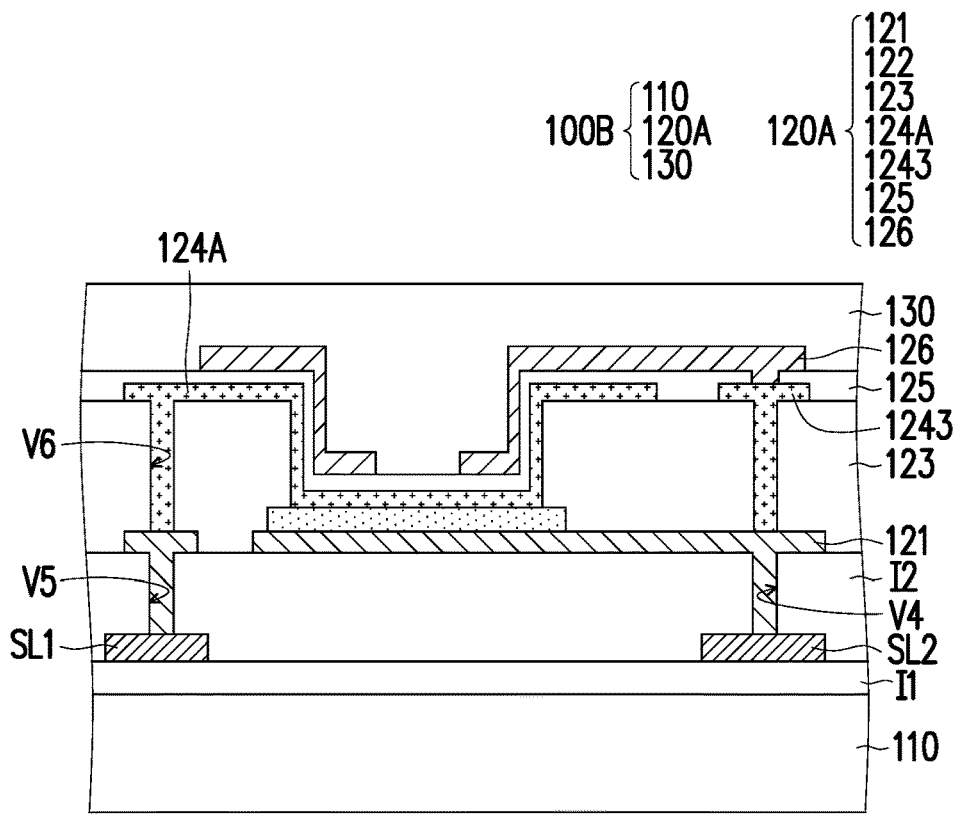
FIG. 3 is a schematic cross-sectional view of a sensing device substrate 100B according to an embodiment of the invention.

FIG. 3 is a schematic cross-sectional view of a sensing device substrate 100B according to an embodiment of the invention. The sensing device substrate 100B includes the substrate 110, the sensing device 120A, and the planarization layer 130, and the sensing device 120A is disposed between the substrate 110 and the planarization layer 130. The sensing device 120A includes the first electrode 121, the sensing layer 122, the second insulating layer 123, the second electrode 124A, the connecting portion 1243, the first insulating layer 125, and the conductive layer 126.

Compared with the sensing device substrate 100A shown in FIG. 2A to FIG. 2C, the structure in the sensing device substrate 100B shown in FIG. 3 is different in that: the first electrode 121 is electrically connected to the second signal line SL2, and the second electrode 124A is electrically connected to the first signal line SL1.

For example, in the present embodiment, the insulating layer I2 may also have a via V4 and a via V5, and the second insulating layer 123 may also have a via V6, and the via V6 is overlapped with the via V5. The first electrode 121 may be connected to the second signal line SL2 via the via V4 of the insulating layer I2, and the second electrode 124A may be connected to the first signal line SL1 via the via V6 of the second insulating layer 123 and the via V5 of the insulating layer I2.

Figure 4:
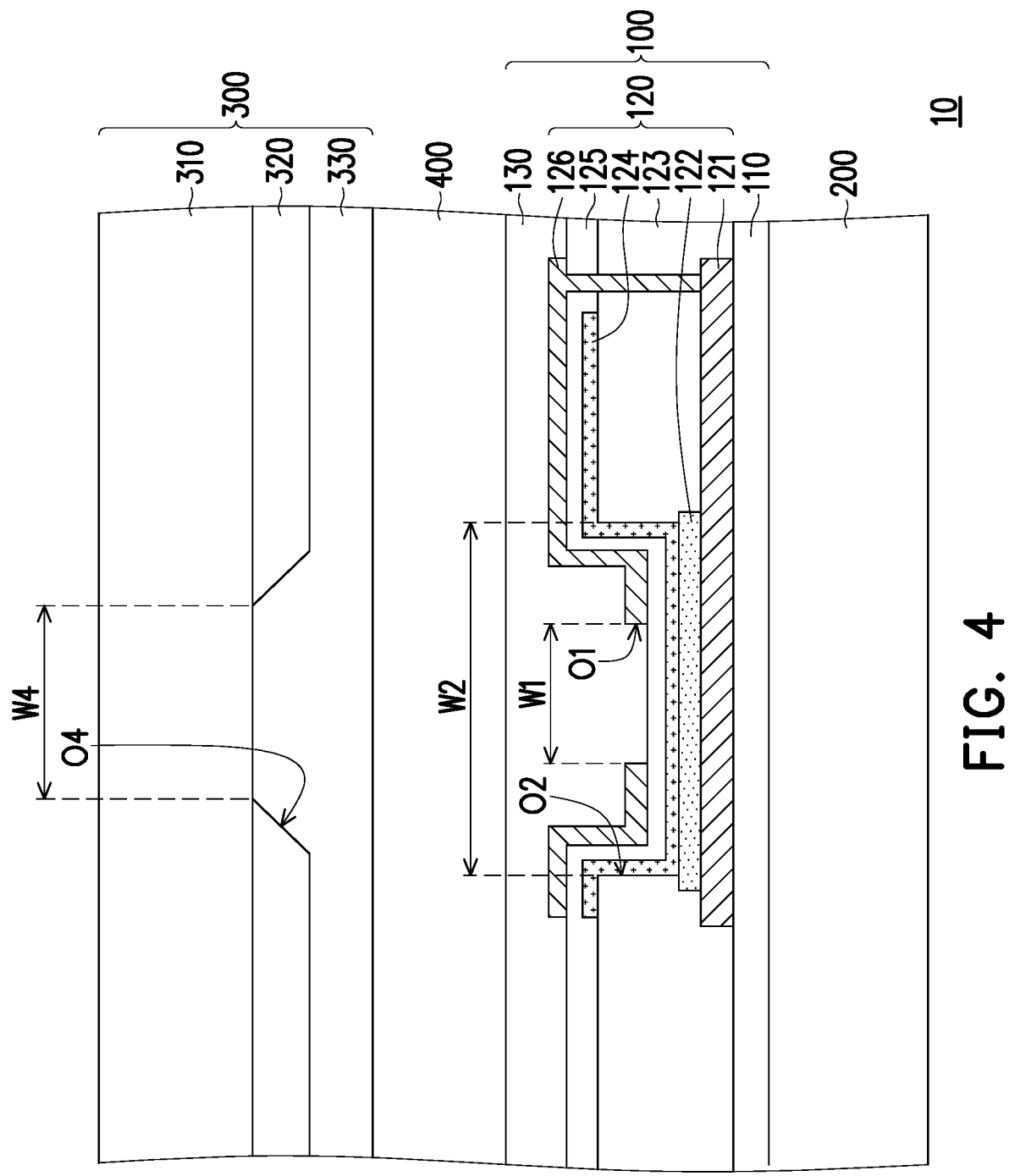
FIG. 4 is a schematic cross-sectional view of a display apparatus 10 of an embodiment of the invention.

FIG. 4 is a schematic cross-sectional view of a display apparatus 10 of an embodiment of the invention. Hereinafter, in conjunction with FIG. 4, the description of the implementation of each device and film layer of the display apparatus 10 is provided, and the reference numerals and related content used in the embodiment of FIG. 1 are adopted, but the invention is not limited thereto.

The display apparatus 10 includes the sensing device substrate 100 and a pixel array substrate 200, wherein the sensing device substrate 100 is overlapped with the pixel array substrate 200. In the present embodiment, the sensing device substrate 100 includes the substrate 110, the sensing device 120, and the planarization layer 130, wherein the sensing device 120 is disposed between the substrate 110 and the planarization layer 130. The sensing device 120 includes the first electrode 121, the sensing layer 122, the second insulating layer 123, the second electrode 124A, the first insulating layer 125, and the conductive layer 126. The structure of the sensing device 120 is similar to that shown in FIG. 1 and is not repeated herein. The structure of the pixel array substrate 200 may be similar to pixel array substrates 200A, 200B, 200C, and 200D described below.

In the present embodiment, the display device 10 further includes a cover substrate 300 and a display medium 400, wherein the sensing device substrate 100 is located between the pixel array substrate 200 and the cover substrate 300, and the display medium 400 is located between the sensing device substrate 100 and the cover substrate 300. The cover substrate 300 may be a light filter substrate. For example, in the present embodiment, the cover substrate 300 may include a substrate 310, a light-shielding layer 320, and a light filter layer 330. In some embodiments, the light filter layer 330 may include a red light filter pattern, a green light filter pattern, and a blue light filter pattern. In the present embodiment, the light-shielding layer 320 has a fourth opening O4, the fourth opening O4 is overlapped with the first opening O1, and an aperture W4 of the fourth opening O4 is larger than the aperture W1 of the first opening O1. In the present embodiment, the aperture W4 of the fourth opening O4 is smaller than the aperture W2 of the second opening O2, but is not limited thereto. In other embodiments, the aperture W4 of the fourth opening O4 may be greater than or equal to the aperture W2 of the second opening O2. The first opening O1 and the fourth opening O4 may adjust the light-receiving angle of the sensing layer 122 to implement the light collimation design, so that the sensing device substrate 100 has a good fingerprint image contrast quality, and the display apparatus 10 has good fingerprint sensing.

Figure 5:
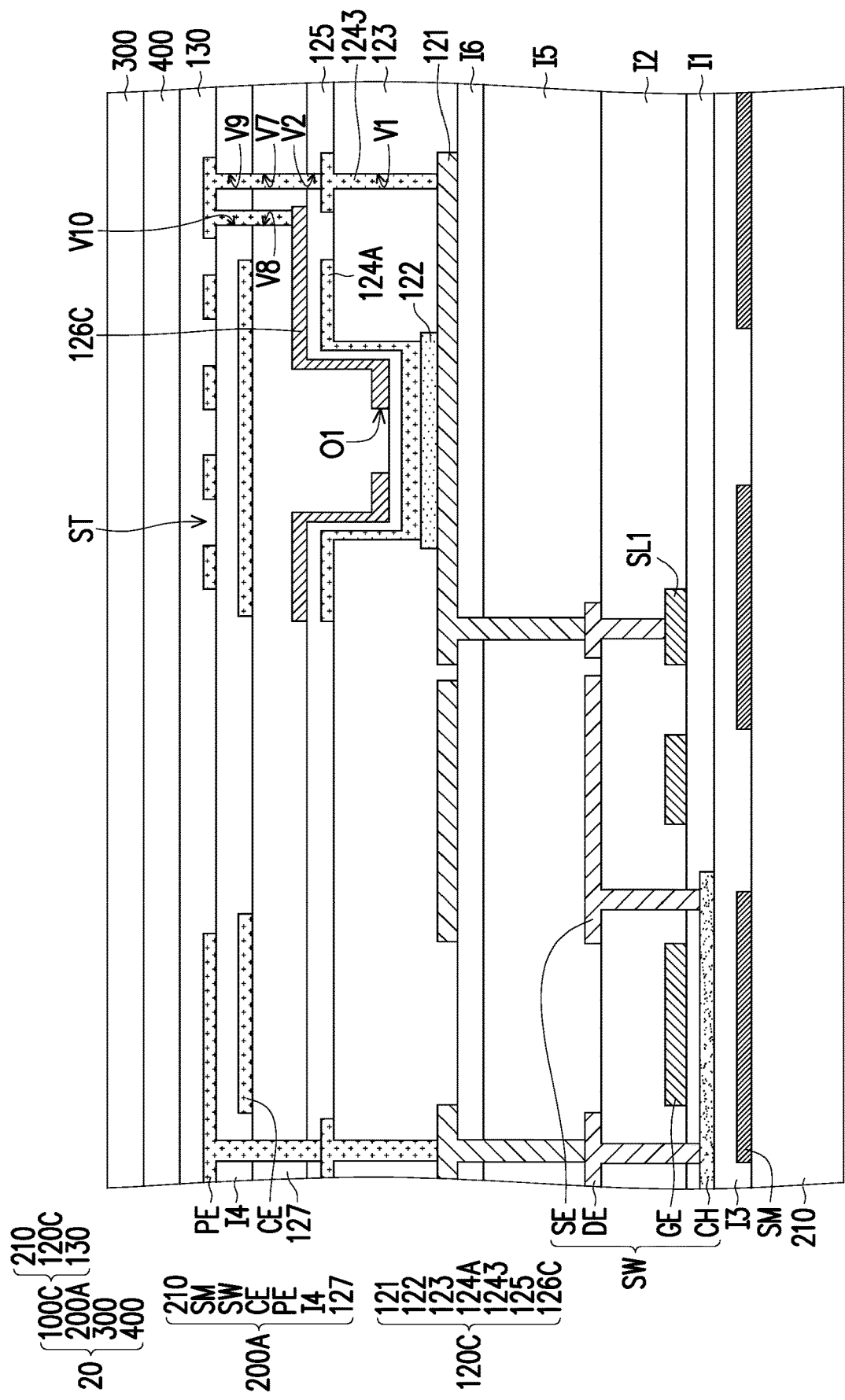
FIG. 5 is a schematic cross-sectional view of a display apparatus 20 of an embodiment of the invention.

FIG. 5 is a schematic cross-sectional view of a display apparatus 20 of an embodiment of the invention. Hereinafter, in conjunction with FIG. 5, the description of the implementation of each device and film layer of the display apparatus 20 is provided, and the reference numerals and related content used in the embodiments of FIG. 2A to FIG. 2C and FIG. 4 are adopted, but the invention is not limited thereto.

The display apparatus 20 includes a sensing device substrate 100C, the pixel array substrate 200A, the cover substrate 300, and the display medium 400. The structure of the cover substrate 300 is similar to that shown in FIG. 4 and is not shown in detail or repeated herein.

Referring to FIG. 5, the pixel array substrate 200A includes a substrate 210, a light-shielding layer SM, a switching device SW, a common electrode CE, a pixel electrode PE, and an insulating layer I4. The substrate 210 may be a transparent substrate, and the material thereof includes a quartz substrate, a glass substrate, a polymer substrate, etc., but the invention is not limited thereto.

The switching device SW includes a gate GE, a semiconductor layer CH, a source SE, and a drain DE. The gate GE is overlapped with the semiconductor layer CH, the semiconductor layer CH is disposed between a buffer layer I3 and the insulating layer I1, and the material of the semiconductor layer CH may include a silicon semiconductor material (such as polysilicon, amorphous silicon, etc.), an oxide semiconductor material, or an organic semiconductor material. Specifically, the region where the semiconductor layer CH is overlapped with the gate GE may be regarded as the channel region of the switching device SW. In addition, the light-shielding layer SM is disposed between the substrate 210 and the buffer layer I3, and the layout area of the light-shielding layer SM may at least shield the channel region to prevent the characteristics of the channel region from being affected by external light irradiation. The material of the light-shielding layer SM may include a material with both lower reflectivity and light transmittance such as a black resin or a light-shielding metal (for example, chromium).

The source SE and the drain DE of the switching device SW are separated from each other, and the source SE and the drain DE are respectively in contact with the semiconductor layer CH. The pixel electrode PE is electrically connected to the drain DE. The switching device SW may be turned on or off by the signals transmitted by the scan lines, and when the switching device SW is turned on, the signals transmitted on the data lines may be transmitted to the pixel electrode PE.

The source SE and the drain DE of the switching device SW may belong to the same film layer, and the material of the source SE, the drain DE, and the gate GE of the switching device SW may include a metal with good conductivity, such as a metal such as aluminum, molybdenum, or titanium, but the invention is not limited thereto. In order to avoid unnecessary short circuits between the members, the insulating layer I1 is disposed between the gate GE and the semiconductor layer CH, the insulating layer I2 is disposed between the film layer forming the source SE and the drain DE and the film layer forming the gate GE, and an insulating layer I5 and an insulating layer I6 are disposed between the film layer forming the source SE and the drain DE and the first electrode 121. Although the gate GE in the present embodiment is located above the semiconductor layer CH, the switching device SW is a top-gate transistor. However, in other embodiments, the gate GE may also be located under the semiconductor layer CH, so that the switching device SW is a bottom-gate transistor.

In the present embodiment, the common electrode CE is disposed under the insulating layer I4, and the pixel electrode PE is disposed above the insulating layer I4 and provided with a plurality of slits ST. In this way, when driven by an electric field, the electric field formed between the pixel electrode PE and the common electrode CE may pass through the slits ST in the pixel electrode PE to drive the display medium 400, but the invention is not limited thereto. In other embodiments, the pixel electrode PE may be disposed under the insulating layer I4, and the common electrode CE may be disposed above the insulating layer I4 and provided with the plurality of slits ST. When driven by an electric field, the electric field formed between the pixel electrode PE and the common electrode CE may pass through the slits ST in the common electrode CE to drive the display medium 400.

Compared with the sensing device substrate 100A shown in FIG. 2A to FIG. 2C, the structure in the sensing device substrate 100C of the display apparatus 20 shown in FIG. 5 is different in that: the sensing device substrate 100C includes the substrate 210, a sensing device 120C, and the planarization layer 130, and the sensing device 120C is located between the film layer forming the source SE and the drain DE of the switching device SW and the common electrode CE. In other words, the substrate 210 of the pixel array substrate 200A may be used as the substrate of the sensing device substrate 100C at the same time. In some embodiments, the sensing device 120C of the sensing device substrate 100C may be overlapped with the pixel electrode PE or the common electrode CE of the pixel array substrate 200A.

In the present embodiment, the sensing device 120C and the switching device SW of the pixel array substrate 200A are located in different layers. Therefore, the layout design of the sensing device 120C is not limited to the layout design of the switching device SW and the scan lines or data lines connected thereto. Therefore, the sensing device 120C may have greater flexibility in device layout design.

In the present embodiment, the sensing device 120C includes the first electrode 121, the sensing layer 122, the second insulating layer 123, the second electrode 124A, the connecting portion 1243, the first insulating layer 125, and a conductive layer 126C. The conductive layer 126C may be electrically connected to the first electrode 121 via the pixel electrode PE, and the first electrode 121 may be connected to the first signal line SL1 via the vias in the insulating layer I6, the insulating layer I5, and the insulating layer I2. In other embodiments, when the pixel electrode PE is disposed under the insulating layer I4 and the common electrode CE is disposed above the insulating layer I4, the conductive layer 126C may be electrically connected to the first electrode 121 via the common electrode CE.

In the present embodiment, the pixel array substrate 200A may further include a planarization layer 127. Specifically, in the present embodiment, the planarization layer 127 is disposed between the common electrode CE and the conductive layer 126C. The planarization layer 127 may have a via V7 and a via V8, and the insulating layer I4 may have a via V9 and a via V10, wherein the via V9 is overlapped with the via V7, and the via V10 is overlapped with the via V8. The conductive layer 126C may be connected to the pixel electrode PE via the via V8 and the via V10; the pixel electrode PE may be connected to the connecting portion 1243 via the via V9, the via V7, and the via V2 of the first insulating layer 125; and the connecting portion 1243 may be connected to the first electrode 121 via the via V1 in the second insulating layer 123. In this way, in the process of forming the pixel electrode PE, the electrical connection between the conductive layer 126C and the connecting portion 1243 may be completed at the same time, and no additional photomask is needed. In addition, the sensing device 120C and the switching device SW of the pixel array substrate 200A are located in different film layers, so the flexibility of the device layout design may be increased.

Figure 6:
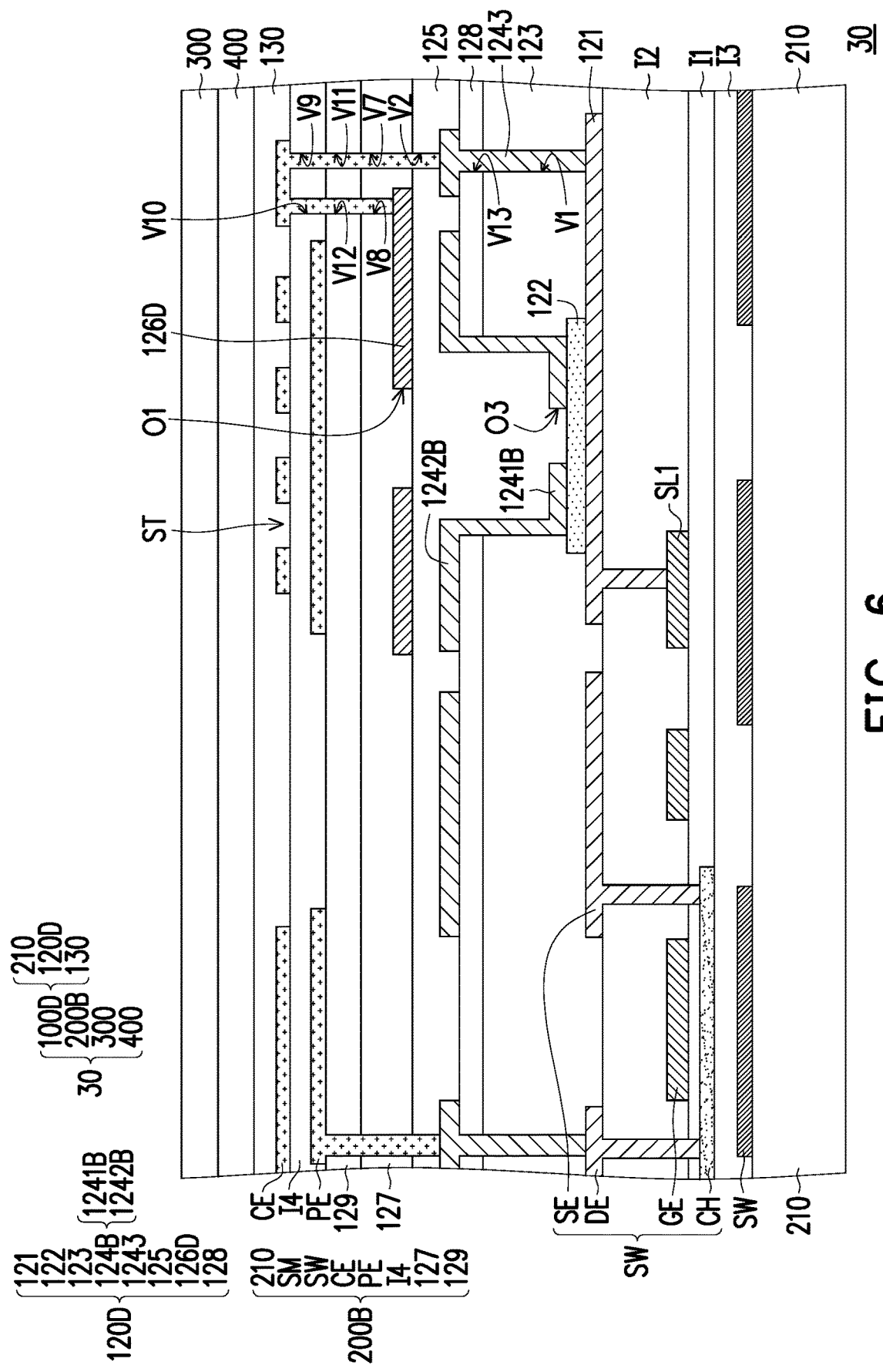
FIG. 6 is a schematic cross-sectional view of a display apparatus 30 of an embodiment of the invention.

FIG. 6 is a schematic cross-sectional view of a display apparatus 30 of an embodiment of the invention. Compared with the display apparatus 20 shown in FIG. 5, the structure of the display apparatus 30 shown in FIG. 6 is different in that: the display apparatus 30 includes a sensing device substrate 100D, the pixel array substrate 200B, the cover substrate 300, and the display medium 400. The structure of the cover substrate 300 is similar to that shown in FIG. 4 and is not shown in detail or repeated herein.

Compared with the pixel array substrate 200A shown in FIG. 5, the difference in the structure in the pixel array substrate 200B shown in FIG. 6 is: the pixel array substrate 200B includes the substrate 210, the light-shielding layer SM, the switching device SW, the pixel electrode PE, the common electrode CE, the insulating layer I4, the planarization layer 127, and an insulating layer 129, wherein the common electrode CE is disposed above the insulating layer I4 and provided with the plurality of slits ST, and the pixel electrode PE is disposed under the insulating layer I4.

Referring to FIG. 6, the sensing device substrate 100D includes the substrate 210, a sensing device 120D, and the planarization layer 130, wherein the sensing device 120D is disposed between the substrate 210 and the planarization layer 130.

Compared with the sensing device 120C shown in FIG. 5, the structure in the sensing device 120D shown in FIG. 6 is different in that: the sensing device 120D and the source SE and the drain DE of the switching device SW of the pixel array substrate 200B are located in the second insulating layer 123, and the sensing device 120D includes the first electrode 121, the sensing layer 122, the second insulating layer 123, a second electrode 124B, the connecting portion 1243, the first insulating layer 125, a conductive layer 126D, and an insulating layer 128, wherein the insulating layer 128 is located between the second electrode 124B and the second insulating layer 123. In addition, the first electrode 121 is connected to the first signal line SL1 via the vias in the insulating layer I2.

Specifically, in the present embodiment, the second electrode 124B is an opaque electrode, and the second electrode 124B has a third opening O3. The second electrode 124B may include a metal material, such as molybdenum, aluminum, titanium, copper, gold, silver, or other conductive materials, or a stack of any two or more of the above materials. However, the invention is not limited thereto. In some embodiments, the second electrode 124B may include a sensing portion 1241B and an extending portion 1242B, wherein the sensing portion 1241B has the third opening O3.

In the present embodiment, the conductive layer 126D is disposed between the first insulating layer 125 and the planarization layer 127, and the conductive layer 126D has the first opening O1. The third opening O3 of the second electrode 124B is overlapped with the first opening O1, and the third opening O3 is smaller than the first opening O1. Via the combination of the third opening O3 and the first opening O1, the light-receiving angle of the sensing layer 122 may be adjusted to implement a light collimation design.

In the present embodiment, the insulating layer 129 is located between the planarization layer 127 and the insulating layer I4. Specifically, in the present embodiment, the insulating layer 129 may have a via V11 and a via V12, and the via V11 is overlapped with the via V7 and the via V9, and the via V12 is overlapped with the via V8 and the via V10. In addition, the insulating layer 128 may have a via V13, and the via V13 is overlapped with the via V1 of the second insulating layer 123. The conductive layer 126D may be connected to the common electrode CE via the via V8, the via V12, and the via V10; the common electrode CE may be connected to the connecting portion 1243 via the via V9, the via V11, the via V7, and the via V2 in the first insulating layer 125; and the connecting portion 1243 may be connected to the first electrode 121 via the via V13 in the insulating layer 128 and the via V1 in the second insulating layer 123. In this way, in the process of forming the common electrode CE, the electrical connection between the conductive layer 126D and the first electrode 121 may be completed at the same time, and no additional photomask is needed.

In some embodiments, the conductive layer 126D in the above embodiments may also be omitted, and the common electrode CE is used as the conductive layer of the sensing device 120D. In this way, the step of manufacturing the conductive layer 126D may be eliminated, and the process steps of the sensing device 120D are simplified.

Figure 7:
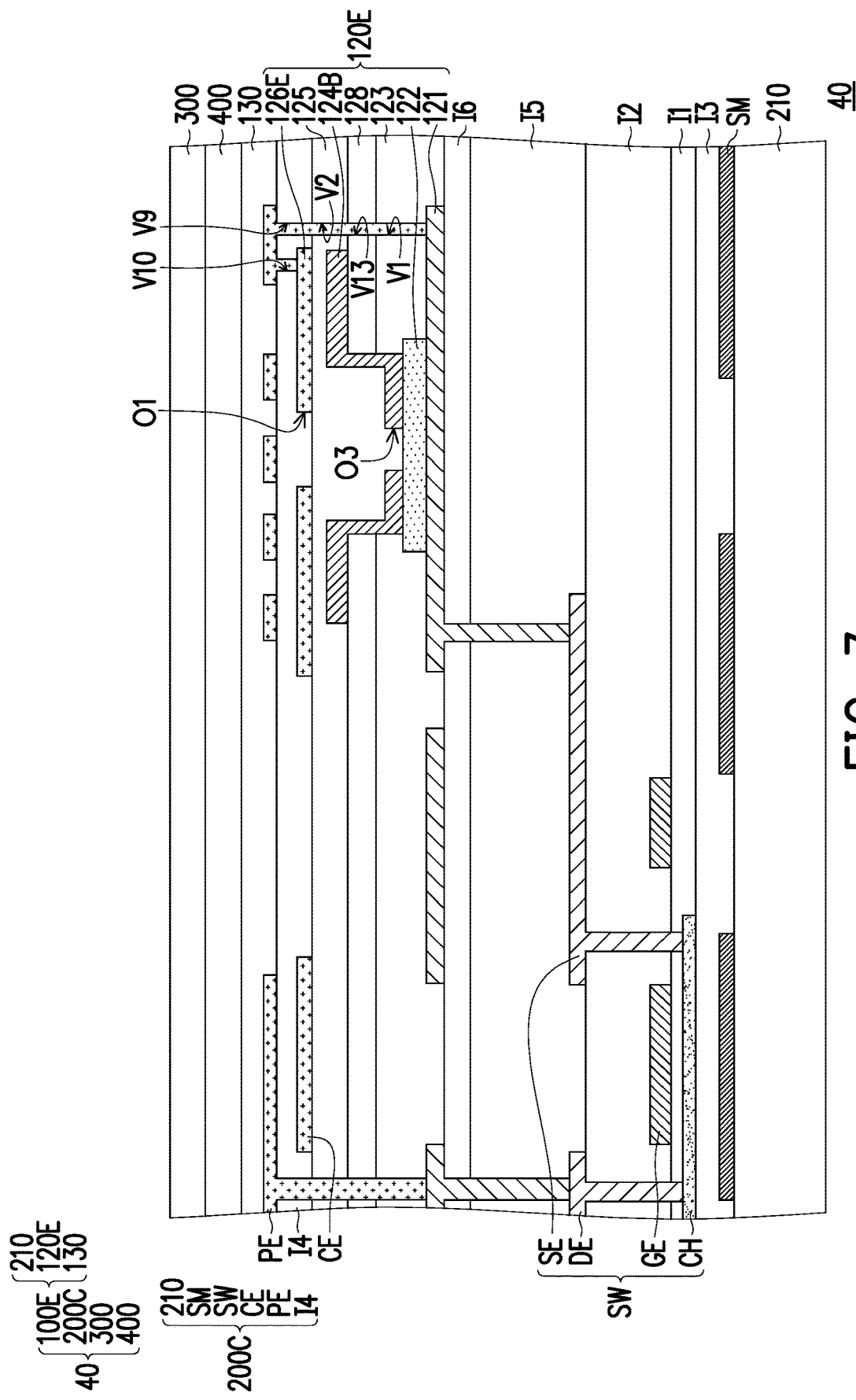
FIG. 7 is a schematic cross-sectional view of a display apparatus 40 of an embodiment of the invention.

FIG. 7 is a schematic cross-sectional view of a display apparatus 40 of an embodiment of the invention. Compared with the display apparatus 20 shown in FIG. 5, the structure of the display apparatus 40 shown in FIG. 7 is different in that: the display apparatus 40 includes a sensing device substrate 100E, the pixel array substrate 200C, the cover substrate 300, and the display medium 400. The structure of the cover substrate 300 is similar to that shown in FIG. 4 and is not shown in detail or repeated herein.

Compared with the pixel array substrate 200A shown in FIG. 5, the difference in the structure in the pixel array substrate 200C shown in FIG. 7 is: the pixel array substrate 200C includes the substrate 210, the light-shielding layer SM, the switching device SW, the pixel electrode PE, the common electrode CE, and the insulating layer I4.

Referring to FIG. 7, the sensing device substrate 100E includes the substrate 210, a sensing device 120E, and the planarization layer 130, wherein the sensing device 120E is disposed between the substrate 210 and the planarization layer 130.

Compared with the sensing device 120C shown in FIG. 5, the structure in the sensing device 120E shown in FIG. 7 is different in that: the sensing device 120E includes the first electrode 121, the sensing layer 122, the second insulating layer 123, the second electrode 124B, the first insulating layer 125, a conductive layer 126E, and the insulating layer 128, wherein the conductive layer 126E is electrically connected to the first electrode 121 via the pixel electrode PE, and the conductive layer 126E is the common electrode CE. In addition, the first electrode 121 may be electrically connected to the source SE of the switching device SW via the vias in the insulating layer I6 and the insulating layer I5.

In other embodiments, the pixel electrode PE may be disposed under the insulating layer I4, and the common electrode CE may be disposed above the insulating layer I4 and provided with the plurality of slits ST. In this case, the conductive layer 126E may be electrically connected to the first electrode 121 via the common electrode CE, and the conductive layer 126E is the pixel electrode PE.

In the present embodiment, the second electrode 124B is an opaque electrode, and the second electrode 124B has the third opening O3. The second electrode 124B may include a metal material, such as molybdenum, aluminum, titanium, copper, gold, silver, or other conductive materials, or a stack of any two or more of the above materials. However, the invention is not limited thereto.

In the present embodiment, the conductive layer 126E is disposed between the first insulating layer 125 and the insulating layer I4, the conductive layer 126E is a transparent conductive layer, and the conductive layer 126E has the first opening O1. The third opening O3 of the second electrode 124B is overlapped with the first opening O1, and the third opening O3 is smaller than the first opening O1. In the present embodiment, the conductive layer 126E may be connected to the pixel electrode PE via the via V10, and the pixel electrode PE may be connected to the first electrode 121 via the via V9, the via V2, the via V13, and the via V1. Since the conductive layer 126E and the common electrode CE are the same film layer, the process steps of the sensing device 120E may be simplified.

Figure 8A:
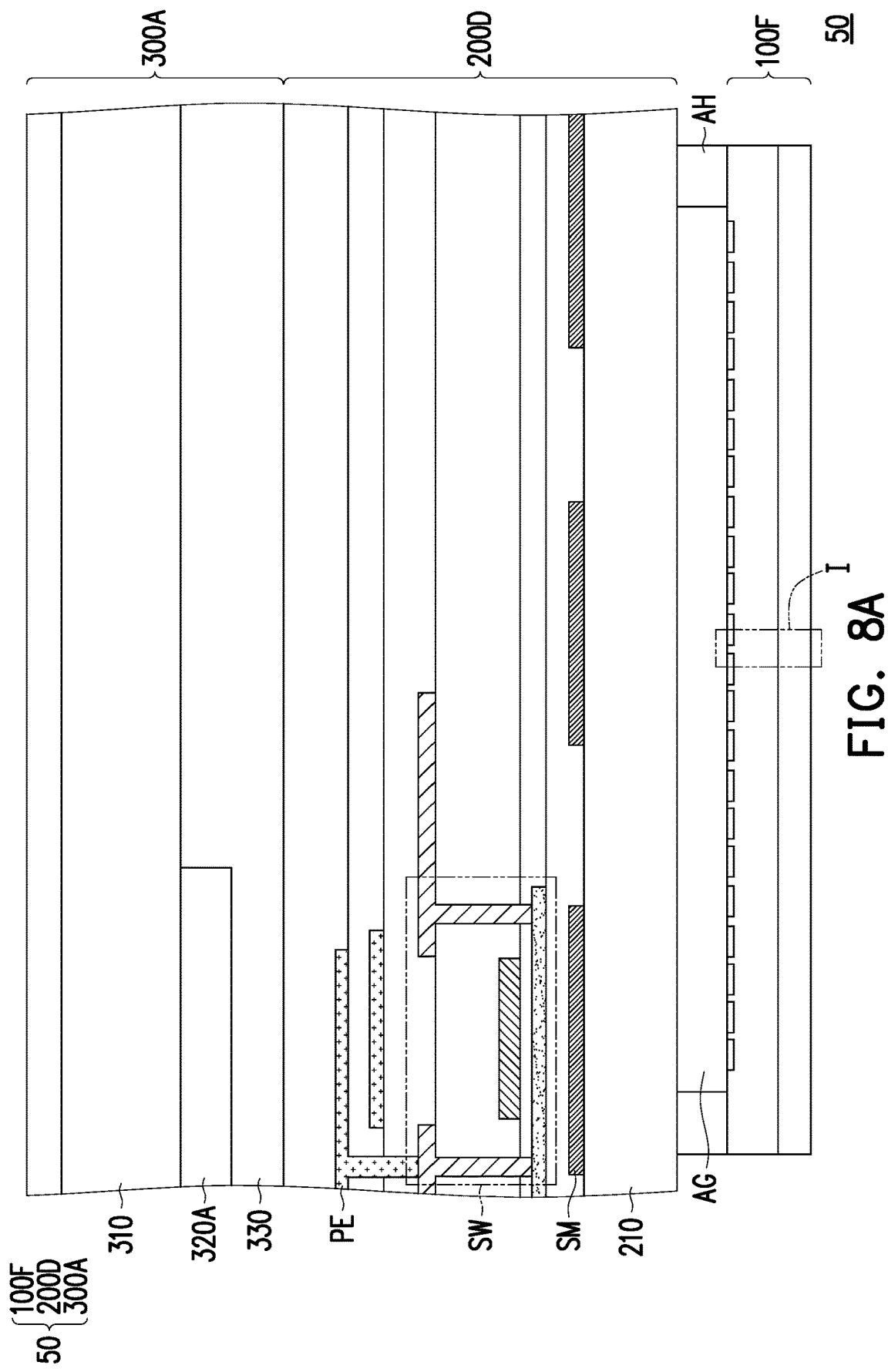
FIG. 8A is a schematic cross-sectional view of a display apparatus 50 of an embodiment of the invention.
Figure 8B:
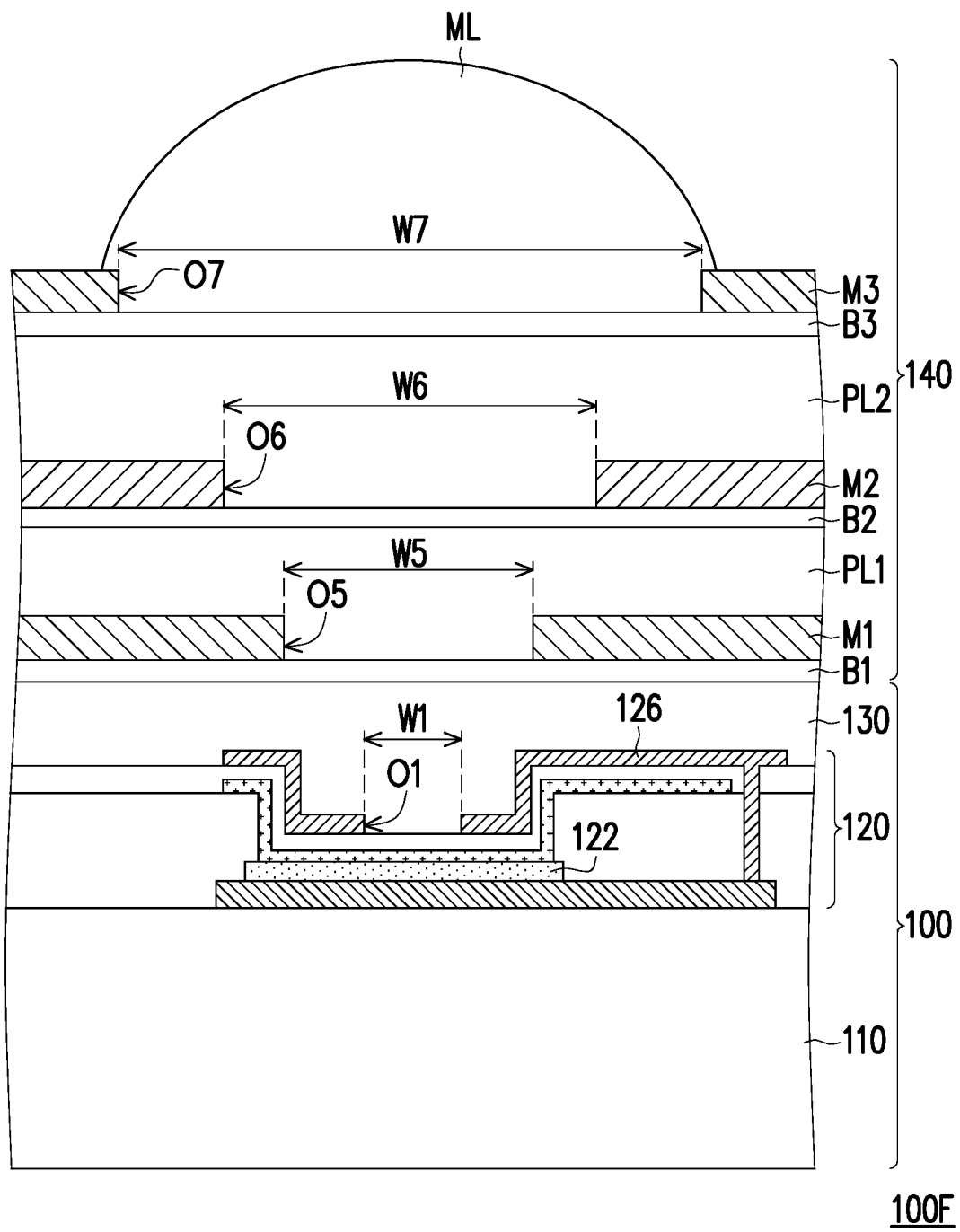
FIG. 8B is an enlarged schematic diagram of a region I of a sensing device substrate 100F of the display apparatus 50 of FIG. 8A.

FIG. 8A is a schematic cross-sectional view of a display apparatus 50 of an embodiment of the invention. FIG. 8B is an enlarged schematic diagram of a region I of a sensing device substrate 100F of the display apparatus 50 of FIG. 8A. Hereinafter, in conjunction with FIG. 8A to FIG. 8B, the description of the implementation of each device and film layer of the display apparatus 50 is provided, and the reference numerals and related content used in the embodiment of FIG. 1 are adopted, but the invention is not limited thereto.

Referring to FIG. 8A, the display apparatus 50 includes the sensing device substrate 100F, the pixel array substrate 200D, and a cover substrate 300A, wherein the pixel array substrate 200D is located between the sensing device substrate 100F and the cover substrate 300A. In the present embodiment, the pixel array substrate 200D includes the substrate 210, the switching device SW, the pixel electrode PE, and the light-shielding layer SM. In some embodiments, the pixel array substrate 200D may be an organic light-emitting device array substrate. In the present embodiment, the cover substrate 300A includes the substrate 310, the light-shielding layer 320A, and the light filter layer 330. In some embodiments, the light-shielding layer 320A is overlapped with the switching device SW. In addition, the sensing device substrate 100F may be fixed on the substrate 210 by an adhesive layer AH, and the sensing device substrate 100F and the switching device SW are respectively located on two opposite sides of the substrate 210. In some embodiments, there may be a gap AG between the sensing device substrate 100F and the substrate 210.

Referring to FIG. 8B, in the present embodiment, the sensing device substrate 100F includes the sensing device substrate 100 as shown in FIG. 1. The sensing device substrate 100 includes the substrate 110, the sensing device 120, and the planarization layer 130, and the sensing device 120 is located between the substrate 110 and the planarization layer 130. In other embodiments, the sensing device substrate 100F may also include the sensing device substrate 100A as shown in FIG. 2A to FIG. 2C or the sensing device substrate 100B as shown in FIG. 3.

In the present embodiment, the sensing device substrate 100F further includes a dimming structure 140, wherein the dimming structure 140 is disposed on the sensing device 120, and the dimming structure 140 is located between the sensing device 120 and the pixel array substrate 200D.

The dimming structure 140 includes an insulating layer B1, a metal layer M1, a planarization layer PL1, an insulating layer B2, a metal layer M2, a planarization layer PL2, an insulating layer B3, a metal layer M3, and a microlens structure ML. The metal layer M1 has a fifth opening O5, the metal layer M2 has a sixth opening O6, the metal layer M3 has a seventh opening O7, and the fifth opening O5, the sixth opening O6, and the seventh opening O7 are all overlapped with the first opening O1 of the conductive layer 126. The microlens structure ML may be a lens structure with a larger central thickness than an edge thickness, such as a symmetrical double-convex lens, an asymmetrical double-convex lens, a plano-convex lens, or a meniscus lens. The microlens structure ML may improve light collimation, so that the issue of light leakage and light mixing caused by scattered light or refracted light may be reduced, thereby reducing light loss.

In the present embodiment, an aperture W5 of the fifth opening O5 is larger than the aperture W1 of the first opening O1 of the conductive layer 126, the aperture W5 of the fifth opening O5 is smaller than an aperture W6 of the sixth opening O6, and the aperture W6 of the sixth opening O6 is smaller than an aperture W7 of the seventh opening O7. In other words, the apertures of the seventh opening O7, the sixth opening O6, the fifth opening O5, and the first opening O1 are decreased in order, and the central axes of the first opening O1, the fifth opening O5, the sixth opening O6, and the seventh opening O7 are overlapped. In this way, the dimming structure 140 may adjust the light-receiving angle of the sensing layer 122 together with the first opening O1 to implement a light collimation design.

Based on the above, the sensing device substrate of the invention reduces the dark current of the sensing device by reducing the area of the sensing layer, thereby improving the light/dark current ratio of the sensing device, thereby improving the contrast quality of fingerprint images. At the same time, the sensing device substrate of the invention also utilizes the capacitance formed by the conductive layer and the second electrode to supplement the capacitance of the sensing device, so as to provide good circuit coupling efficiency. Moreover, in the display apparatus of the invention, the first opening of the conductive layer of the sensing device substrate may adjust the light-receiving angle of the sensing layer together with, for example, the fourth opening of the light-shielding layer of the cover substrate or the dimming structure, thereby implementing a light collimation design, so that the sensing device substrate has good fingerprint image contrast quality, and the display apparatus has good fingerprint sensing.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A sensing device substrate, comprising:
a substrate; and
a sensing device located on the substrate, wherein the sensing device comprises:
a first electrode located on the substrate;
a second electrode overlapped with the first electrode;
a sensing layer located between the second electrode and the first electrode;
a conductive layer overlapped with the second electrode and electrically connected to the first electrode, wherein the conductive layer has a first opening, and the first opening is overlapped with the sensing layer; and
a first insulating layer located between the conductive layer and the second electrode,
wherein the second electrode is disposed between the first electrode and the conductive layer, the sensing device comprises a first capacitance and a second capacitance, the first capacitance is comprised of the first electrode and a first portion of the second electrode that is overlapped with the sensing layer in top view, and the second capacitance is comprised of the conductive layer and a second portion of the second electrode that is not overlapped with the sensing layer and is overlapped with the conductive layer in top view.

2. The sensing device substrate of claim 1, wherein the sensing device further comprises a second insulating layer, and the second insulating layer is located between the second electrode and the first electrode and has a second opening, wherein the second opening is overlapped with the sensing layer.

3. The sensing device substrate of claim 2, wherein an area ratio of the first opening to the second opening is between 1/9 and 4/9.

4. The sensing device substrate of claim 1, wherein the first insulating layer is sandwiched between the conductive layer and the second electrode, the first insulating layer has a via, and the conductive layer is electrically connected to the first electrode through the via of the first insulating layer.

5. The sensing device substrate of claim 1, wherein the second electrode is a transparent electrode.

6. The sensing device substrate of claim 5, wherein the conductive layer is an opaque conductive layer.

7. The sensing device substrate of claim 1, wherein the second electrode is an opaque electrode and has a third opening, wherein the third opening is overlapped with the first opening.

8. The sensing device substrate of claim 7, wherein the third opening is smaller than the first opening.

9. The sensing device substrate of claim 1, further comprising a first signal line and a second signal line disposed on the substrate, wherein the first electrode is electrically connected to one of the first signal line and the second signal line, and the second electrode is electrically connected to the other of the first signal line and the second signal line.

10. A display apparatus, comprising:
a pixel array substrate; and
the sensing device substrate of claim 1 overlapped with the pixel array substrate.

11. The display apparatus of claim 10, wherein the pixel array substrate comprises a pixel electrode and a common electrode, and the conductive layer is electrically connected to the first electrode via one of the pixel electrode and the common electrode.

12. The display apparatus of claim 11, wherein the conductive layer is the other of the pixel electrode and the common electrode.

13. The display apparatus of claim 10, further comprising a cover substrate, wherein the sensing device substrate is located between the pixel array substrate and the cover substrate.

14. The display apparatus of claim 13, wherein the cover substrate comprises a light-shielding layer, the light-shielding layer has a fourth opening, and the fourth opening is overlapped with the first opening.

15. The display apparatus of claim 14, wherein the fourth opening is larger than the first opening.

16. The display apparatus of claim 15, wherein the sensing device further comprises a second insulating layer, and the second insulating layer is located between the second electrode and the first electrode and has a second opening, wherein the second opening is overlapped with the sensing layer.

17. The display apparatus of claim 10, further comprising a cover substrate, wherein the pixel array substrate is located between the sensing device substrate and the cover substrate.

18. The display apparatus of claim 17, wherein the sensing device substrate further comprises a dimming structure, the dimming structure is located between the sensing device and the pixel array substrate, the dimming structure has a fifth opening, and the fifth opening is overlapped with the first opening.

19. The display apparatus of claim 18, wherein the fifth opening is larger than the first opening.

* * * * *